US007666777B2

(12) United States Patent
Bauer et al.

(10) Patent No.: US 7,666,777 B2
(45) Date of Patent: Feb. 23, 2010

(54) ELECTRONIC STRUCTURE WITH COMPONENTS CONNECTED BY WAY OF SOLDERABLE CONNECTING ELEMENTS AND METHOD

(75) Inventors: Michael Bauer, Nittendorf (DE); Markus Brunnbauer, Lappersdorf (DE); Irmgard Escher-Poeppel, Regensburg (DE); Jens Pohl, Bernhardswald (DE); Christian Stuempfl, Schwandorf (DE)

(73) Assignee: Infineon Technologies AG, Neubiberg (DE)

( * ) Notice: Subject to any disclaimer, the term of this patent is extended or adjusted under 35 U.S.C. 154(b) by 305 days.

(21) Appl. No.: 11/601,540

(22) Filed: Nov. 17, 2006

(65) Prior Publication Data
US 2007/0117424 A1    May 24, 2007

(30) Foreign Application Priority Data
Nov. 18, 2005    (DE) .................. 10 2005 055 487

(51) Int. Cl.
*H01L 21/00*    (2006.01)
(52) U.S. Cl. ................. 438/612; 438/106; 257/E23.021
(58) Field of Classification Search ......... 438/613–617, 438/612, 106–110; 257/734–738, E23.021, 257/E23.069
See application file for complete search history.

(56) References Cited

U.S. PATENT DOCUMENTS

| 5,222,014 | A | | 6/1993 | Lin |
| 5,477,087 | A | * | 12/1995 | Kawakita et al. ............ 257/737 |
| 5,641,113 | A | | 6/1997 | Somaki et al. |
| 5,841,198 | A | | 11/1998 | Chia et al. |
| 6,097,097 | A | | 8/2000 | Hirose |
| 6,259,159 | B1 | | 7/2001 | Dalal et al. |
| 6,278,184 | B1 | | 8/2001 | Brofman et al. |
| 6,569,753 | B1 | | 5/2003 | Akram et al. |
| 6,740,546 | B2 | | 5/2004 | Corisis et al. |
| 6,800,169 | B2 | | 10/2004 | Liu et al. |

* cited by examiner

*Primary Examiner*—Davienne Monbleau
*Assistant Examiner*—Hoa B Trinh
(74) *Attorney, Agent, or Firm*—Dicke, Billig & Czaja, PLLC

(57) ABSTRACT

For the vertical electrical connection of a number of components, an electronic structure with at least two components has solderable connecting elements, which include at least one socket element and a solder ball stacked on the socket element. The socket element has a cylindrical core of an electrically conducting first material with a lateral surface, a bottom surface and a top surface. The core is surrounded with a cladding of an electrically insulating second material in such a way that the lateral surface of the core is covered by the cladding and the top surface and the bottom surface are kept free of the cladding.

9 Claims, 4 Drawing Sheets

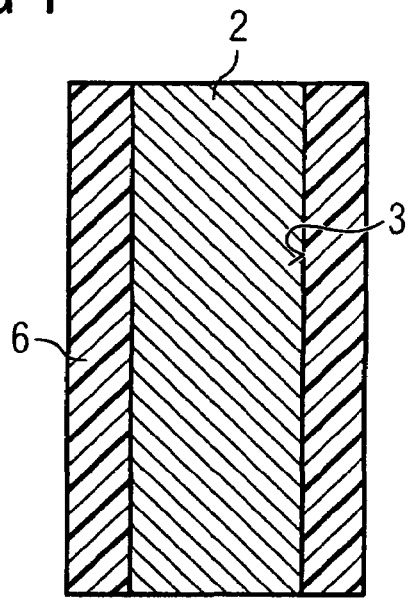
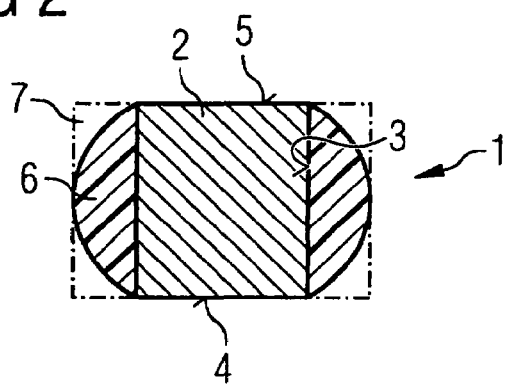
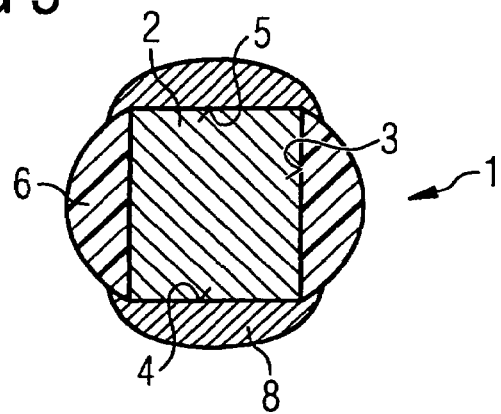

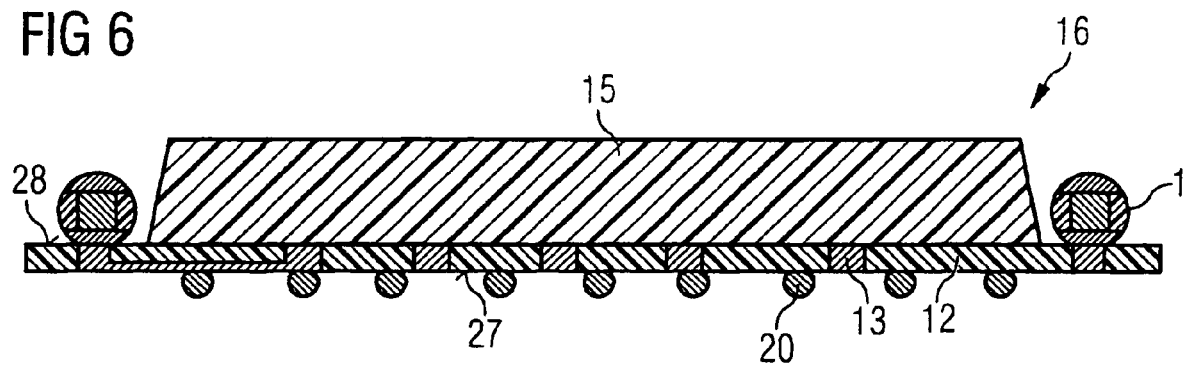
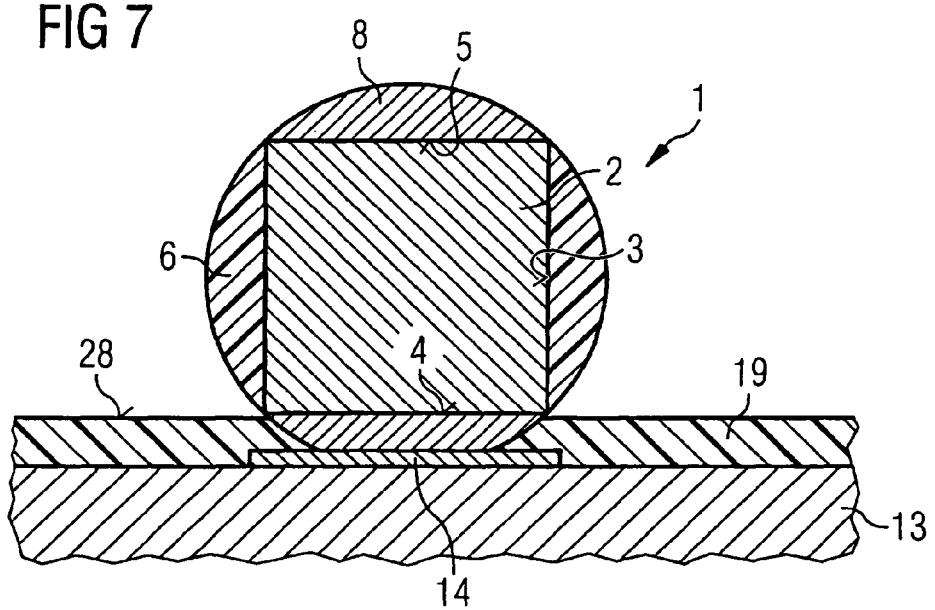

US 7,666,777 B2

ELECTRONIC STRUCTURE WITH COMPONENTS CONNECTED BY WAY OF SOLDERABLE CONNECTING ELEMENTS AND METHOD

CROSS-REFERENCE TO RELATED APPLICATION

This Utility Patent Application claims priority to German Patent Application No. DE 10 2005 055 487.3, filed on Nov. 18, 2005, which is incorporated herein by reference.

BACKGROUND

One aspect of the invention relates to an electronic structure, for example a semiconductor device, which has two or more components connected to one another by way of a number of solderable connecting elements. Aspects of the invention also relates to a method for producing such a structure.

With electronic structures such as surface-mountable semiconductor devices with a wiring substrate and solder balls as external contacts, the height of the external contacts is limited to the diameter of the solder balls. At the same time, the pitch with which the external contacts can be arranged on the underside of a semiconductor device for surface mounting on a higher-level circuit board depends on the diameter of the solder balls. Consequently, the requirement for a greater height of the external contacts because of the unfavorable aspect ratio of the solder balls can only be satisfied at the cost of a greater pitch. However, for space-saving reasons, a small pitch is desirable, because it makes a higher interconnection density possible. The height of the external contacts should therefore be made independent of the diameter of the solder balls.

A known approach to solving this is to form electrodeposited sockets with external contact areas for the solder balls. With such sockets, the height of the external contacts can be made completely independent of the diameter of the solder balls. However, with this approach, that it is technically complex and cost-intensive and does not use the wide range of inexpensive solder ball variants that are on offer in the sector of semiconductor device production.

The document 10 2005 030 946.1, which was not published before the priority date, discloses an electrical connecting element which has a socket ball and a solder ball stacked on the socket ball. The socket ball is electrically connected to a contact terminal area of the wiring substrate and has a protective coating which cannot be wetted by the solder material of the solder ball. A bounding surface of the socket ball is free of the protective coating and integrally bonded with the material of the solder ball.

With this connecting element, the protective coating of the socket ball has to be partially removed before the application of the solder ball in a single method step in order to provide a wettable bounding surface for placing on the solder ball. As a result, this solution is likewise relatively complex and consequently time- and cost-intensive.

SUMMARY

For the vertical electrical connection of a number of components, an electronic structure with at least two components has solderable connecting elements, which include at least one socket element and a solder ball stacked on the socket element. The socket element has a cylindrical core of an electrically conducting first material with a lateral surface, a bottom surface and a top surface. The core is surrounded with a cladding of an electrically insulating second material in such a way that the lateral surface of the core is covered by the cladding and the top surface and the bottom surface are kept free of the cladding.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 illustrates a cross section through a starting body in wire form for producing a solderable connecting element.

FIG. 2 illustrates a cross section through a socket element which forms part of the connecting element.

FIG. 3 illustrates a cross section through an alternative embodiment of the socket element.

FIG. 6 schematically illustrates a cross section through a semiconductor device with socket elements.

FIG. 7 illustrates a cutout from FIG. 6 in detail.

DETAILED DESCRIPTION

Figure 4:
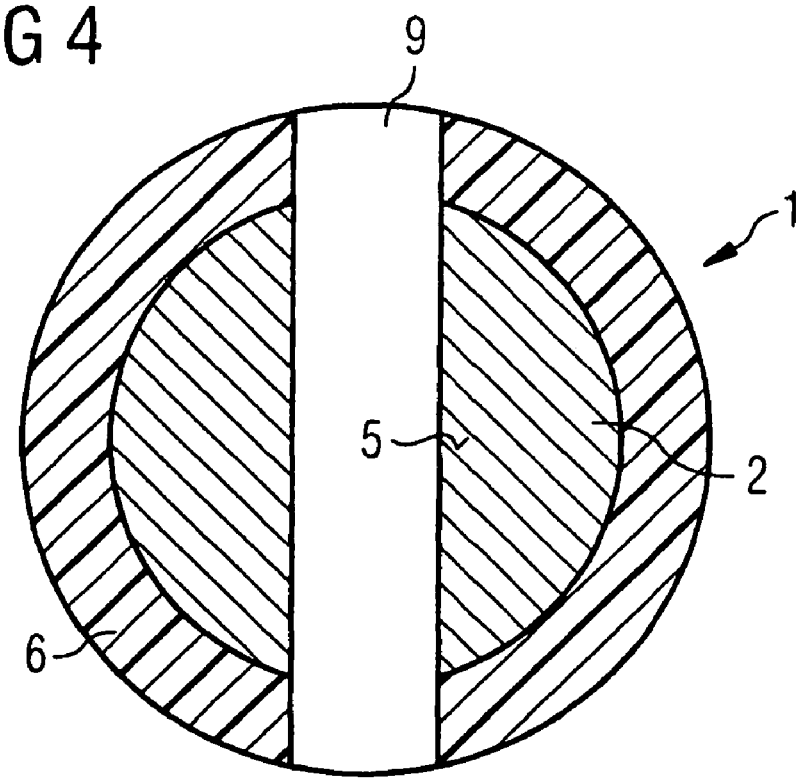
FIG. 4 illustrates a plan view of a further alternative embodiment of the socket element.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One aspect of the invention provides an electronic structure with components connected to one another by way of connecting elements which can be produced with relatively little effort.

In addition, one embodiment of the present invention is to provides a method for producing such an electronic structure.

An electronic structure according to one embodiment of the invention has at least a first component and a second component with contact terminal areas, contact terminal areas of the first component being connected to contact terminal areas of the second component by way of a number of solderable connecting elements. A connecting element thereby inludes at least one socket element and a solder ball stacked on the socket element. The socket element has a cylindrical core of an electrically conducting first material, with a lateral surface, a bottom surface and a top surface.

The core is surrounded with a cladding of an electrically insulating material in such a way that the lateral surface of the core is covered by the cladding and the top surface and the bottom surface of the core are kept free of the cladding.

One aspect of the invention is thereby based on the idea that, for particularly simple processing, the connecting elements should be formed by spherical elements. This is so because spherical elements can be processed by means of component-loading machines that are in any case available for conventional solder balls. However, the connecting elements should have a more favorable aspect ratio than a ball. This can be achieved by the stacking of a number of spherical elements which have at least parts of a solderable material.

In order that the stack of spherical elements does not completely melt, collapse or flow together with adjacent connecting elements and thereby short-circuit a number of contact terminal areas during the soldering process, the lower ball or—if more than two elements are stacked—the lowermost balls should not be able to melt completely. In this way, the stacked structure is preserved even during the soldering process itself.

A solderable metal is provided as the first material for the electrically conducting core and a thermoplastic or thermosetting material is provided as the second material for the cladding.

The bottom surface and/or the top surface may be covered with a cap of a third material, a solderable metal.

The materials are chosen such that the liquidus temperature of the third material is lower than the solidus temperature of the first material. Furthermore, the liquidus temperature of the third material should be lower than the melting temperature of the second material. This is so because in this case the soldering temperature can be chosen such that it only just exceeds the liquidus temperature of the third material, so that only the caps on the top and bottom surfaces melt. This is adequate to produce the soldered connection, and destabilization of the connecting element by complete melting is avoided.

If it is decided not to apply the caps of the third material and to produce the soldered connection by way of the core itself, the liquidus temperature of the first material should be lower than the melting temperature of the second material. This is so because, by suitable choice of the soldering temperature, melting of the cladding can then be prevented, and the cladding can serve during the soldering process as a kind of supporting corset for the connecting element.

To produce an electrical connection, the electrically conductive core must be arranged perpendicularly on the contact terminal area. With the structure according to one embodiment of the invention, this alignment takes place of its own accord if the socket element is soldered on between a contact terminal area wetted with solder paste or flux and a solder ball.

This self-aligning behavior can be further improved by a slit-shaped clearance being introduced into the bottom surface and/or the top surface and filled with a third material. The slit-shaped clearance in the bottom surface is arranged such that it is turned by 90° about the longitudinal axis of the cylindrical core with respect to the clearance in the top surface. The solder ball also consists of the third material.

The connecting element is well suited for stacking a number of semiconductor devices, because when doing so connecting elements with a relatively great aspect ratio are advantageous. Therefore, semiconductor devices and/or wiring substrates may be provided as components.

The electronic structure according to one embodiment of the invention has connecting elements with a favorable aspect ratio that can be flexibly adapted to the respectively intended use. The stacking of a number of socket elements also allows relatively great distances to be overcome without the connecting element becoming unstable or losing its shape during the soldering process.

According to one embodiment of the present invention, a method for producing a semiconductor device with a wiring substrate and a number of virtually spherical soldering structures inludes the following steps: firstly, a wire-like body with a core of an electrically conducting first material and a cladding of an electrically insulating second material is provided and separated into portions with an aspect ratio of around 1.

Subsequently, the portions are worked by rounding off the edges of the cladding so as to obtain socket elements virtually in the form of segments of a sphere, with a cylindrical core, a lateral surface, a bottom surface and a top surface.

Also provided is a wiring substrate with a wiring structure, which has regions for semiconductor devices and, outside these regions, positions with contact terminal areas for attaching solderable connecting structures. The contact terminal areas are provided with solder or flux and loaded with the socket elements as solderable connecting structures.

In the next step, the socket elements are soldered onto the contact terminal areas, the socket elements being aligned in such a way that the longitudinal axis of the core stands perpendicularly on the contact terminal area. Subsequently, the semiconductor device positions are loaded with semiconductor devices while connecting the semiconductor devices to the wiring structure.

Instead of a wiring substrate, a panel with semiconductor device positions arranged in rows and columns may also be provided, the panel having in the semiconductor device positions a wiring structure of the wiring substrates with regions for semiconductor devices and, outside these regions, positions with contact terminal areas for attaching solderable connecting structures.

In this case, the following method steps of loading the contact terminal areas with socket elements, soldering on the socket elements and loading the semiconductor device positions with semiconductor device elements are carried out for the entire panel, which at the end is separated into individual semiconductor devices.

Before the socket elements are applied to the contact terminal areas, caps of a third material, a solderable metal, are applied to the bottom surface and/or the top surface.

As an alternative to this, slit-shaped clearances may also be introduced into the bottom surface and/or top surface and subsequently filled with the third material. The slit-shaped clearances in the bottom surface are in this case arranged such that they are turned by 90° with respect to the clearances in the top surface.

The filled clearances have the task of assisting the socket element to align itself of its own accord with the longitudinal axis of the core perpendicularly to the contact terminal area. In the case of such an arrangement, it is ensured that, irrespective of how the socket element is initially aligned, a part of the socket element that consists of solderable metal comes into contact with the solder of the solder ball or on the contact terminal areas during the soldering process.

The socket element then aligns itself in the desired way as a result of the surface tension of the liquefied solder and the fact that the cladding of the second material has a significantly inferior affinity for wetting by solder than the core or the parts of the socket element that are produced from the third material.

The connecting elements are well suited for the vertical connection of a number of semiconductor devices arranged in a stack to one another. They consequently represent an inexpensive and time-saving alternative to the provision of vias.

To produce a module of stacked semiconductor devices, firstly two or more semiconductor devices are produced by the method described. One semiconductor device is thereby provided as the base element and the other or others are provided as stacking elements.

Further contact terminal areas, which are provided for the electrical connection of a stacking element to the semiconductor device arranged underneath, are provided on the underside of the stacking elements. The further contact terminal areas are loaded with solder balls.

Subsequently, the semiconductor devices are stacked onto the socket elements of the semiconductor devices respectively arranged underneath, while soldering on the solder balls on the underside of the stacking elements, to form a module.

The method according to one embodiment of the invention makes the production of a semiconductor device or stack of semiconductor devices possible with relatively little technical effort and by conventional techniques and machines. The at least approximately spherical shape of the socket elements and their solder-ball-like dimensioning allow them to be processed in just the same way as solder balls by tried-and-tested means.

The self-aligning behavior of the socket elements during soldering means that no additional process step is required in the production of the semiconductor device. Only the provision of the socket elements involves somewhat more effort than in the case of conventional solder balls, but even this can be performed simultaneously for a very large number of socket elements as a result of production being based on a covered wire and subsequent barrel polishing, and is consequently not particularly significant.

FIG. 1 illustrates a body in wire form, which serves as a starting product for the production of a solderable connecting element with a socket element. The body in wire form has a cylindrical core 2 of an electrically conducting first material and a cladding 6 of an electrically insulating second material. A solderable metal is suitable as the first material, while a thermoplastic material with a relatively high melting point or a non-melting thermosetting material is used for the second material of the cladding 6.

To produce the socket elements, the body in wire form is divided up into a multiplicity of portions with an aspect ratio of around 1 by processes such as stamping or cutting. The portions created in this way are further worked in a following method step, for example by barrel polishing.

The second material of the cladding 6 is thereby ground away at the edges 7, as represented in FIG. 2, so that the body created is given the shape of a sphere with flattened poles.

The socket element 1 produced in this way then has a cylindrical core 2 with a lateral surface 3, a bottom surface 4 and a top surface 5, which is surrounded by a cladding 6 of an electrically insulating material.

If a solderable metal is used as the first material for the core 2, the socket element 1 produced in this way can already be used for producing a soldered connection. It may, however, also be provided with caps 8 of a third material on the bottom surface 4 and the top surface 5, as represented in FIG. 3.

The caps 8 consist of a solderable metal, the liquidus temperature of the third material is in one case lower than the solidus temperature of the first material. This prevents the entire socket element 1 from melting when a soldered connection is produced. Only the caps 8, the liquidus temperature of which is lowest, are melted to produce the soldered connection.

The second material, from which the cladding 6 is produced, has a relatively high melting point, which lies at least above the liquidus temperature of the third material, and consequently above the required soldering temperature. This is so because the cladding 6 has the task of keeping the socket element 1 in shape during the production of the soldered connection and of avoiding complete deliquescence, and in particular fusion with adjacent solder structures.

The socket element 1 produced in this way can then be used in principle like a conventional solder ball for connecting solderable surfaces. Unlike conventional solder structures, with the method according to embodiments of the present invention, it is possible to produce relatively large solder structures, which in spite of their large volume do not completely melt and deliquesce, which would typically lead to short-circuits. Rather, they maintain their approximately spherical shape and are additionally protected by the electrically insulating cladding 6 from undesired electrical contact with adjacent solder structures.

The socket elements 1 can easily be produced in large numbers from a body in wire form by means of simple processes. The subsequent working and rounding off of the edges 7 of the cladding 6 can also be carried out simultaneously for a very large number of socket elements by processes such as barrel polishing.

The socket elements 1 have an approximately spherical shape and can consequently be processed by conventional techniques and apparatuses, as are used for simple solder balls. It is therefore not necessary to introduce special apparatuses in place of the infrastructure in the production line that is already available, for example for loading semiconductor devices with the socket elements 1 according to the invention.

As an alternative to applying the caps 8, the bottom surface 4 and the top surface 5 may also be provided with slit-shaped clearances 9. This exemplary embodiment is illustrated in FIG. 4.

Figure 5:
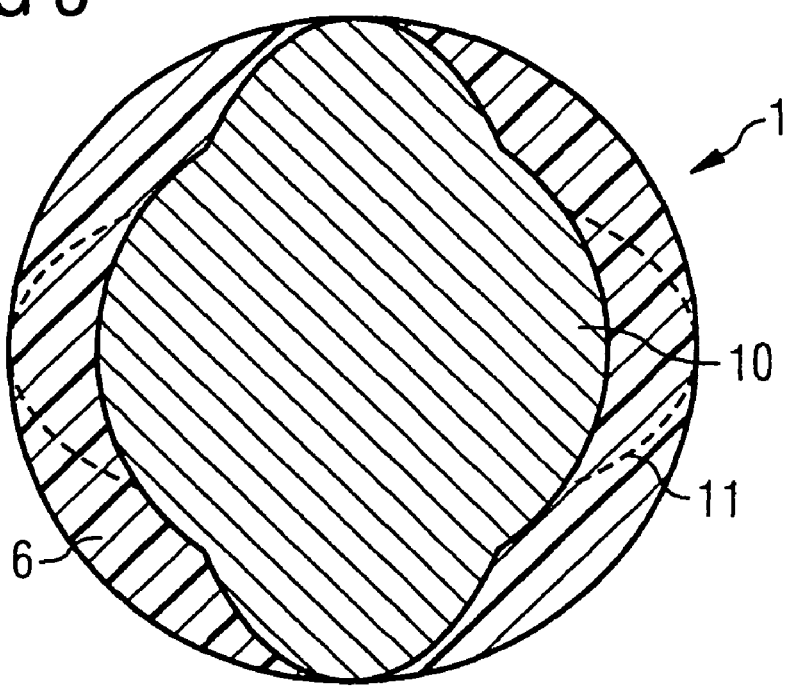
FIG. 5 illustrates a plan view of the socket element according to FIG. 4 after a further method step.

As represented in FIG. 5, the slit-shaped clearances 9 are subsequently filled with a third material and provided with a covering 10 of the third material, typically a solderable metal. In this case, the slit-shaped clearances 9, and possibly also the coverings 10, in the bottom surface 4 and the top surface 5 may be turned by 90 degrees with respect to one another. In FIG. 5, this is indicated by the dashed line 11, which represents the contour of the covering 10 on the bottom surface 4, which is not illustrated.

The socket elements 1 are well suited for the production of a vertical electrical connection with a stack of semiconductor devices. This is so because relatively high solder structures, which must not however completely melt during the soldering process, are required for this application.

The semiconductor device 16 according to FIG. 6 has a wiring substrate 12 with a wiring structure 13, on which a semiconductor chip that is not represented in any more detail and is protected by a plastic package 15 is arranged. The semiconductor device 16 has on the underside 27 of the wiring substrate 12 a row of conventional solder structures 20, by way of which it can be connected to a substrate that is not represented.

The surface 28 of the wiring substrate 12 can also be contacted, to be precise not only inside the plastic package 15, where the semiconductor chip is located, but also outside the plastic package 15. For this purpose, socket elements 1 are applied to contact terminal areas on the upper side 28 that are not represented in any more detail.

FIG. 7 illustrates the socket elements 1 on the upper side 28 in detail. The wiring structure 13 is covered with a solder resist layer 19 for electrical insulation, selected regions being left free of the solder resist layer 19 and provided with electrically conducting contact terminal areas 14. The socket element 1 is arranged on the contact terminal area 14 in such a way that the longitudinal axis of the cylindrical core 2 stands perpendicularly on the contact area 14.

In the case of this arrangement there is an electrically conducting connection from the contact area 14 by way of the cap 8 on the bottom surface 4, the core 2 and the cap 8 on the top surface 5, while the sides of the socket element 1 are electrically insulated by the cladding 6. The socket element 1 can consequently be contacted from above, but not from the sides, to produce an electrically conducting connection.

Figure 8:
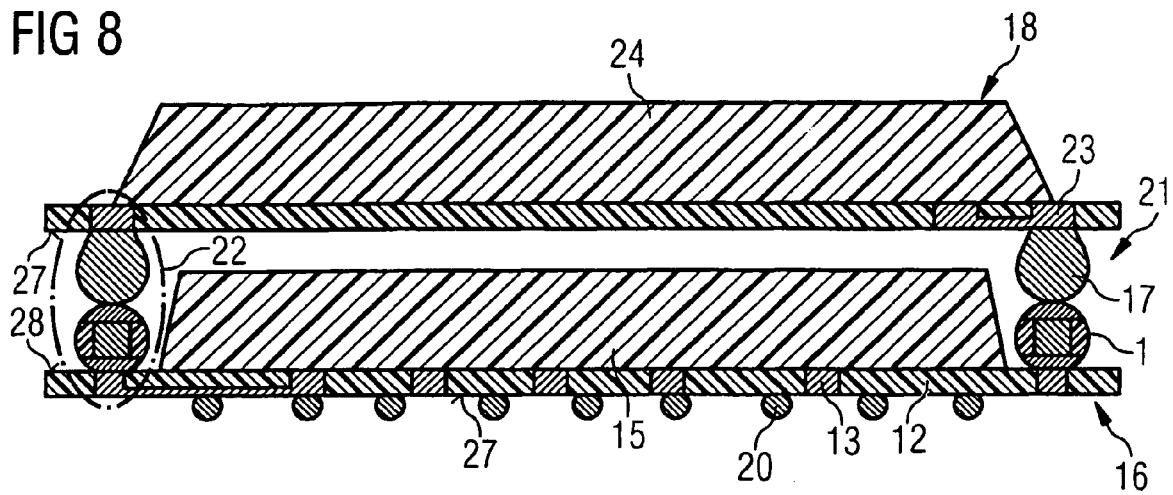
FIG. 8 schematically illustrates a cross section through a stack comprising two semiconductor devices, which are vertically connected to one another by a connecting element.

This is necessary if, as represented in FIG. 8, the semiconductor device 16 is to be joined together with a further semiconductor device 18 to form a stack 21. The further semiconductor device 18 likewise has a wiring substrate with a wiring structure 23 and also a plastic package 24, which surrounds one or more semiconductor chips that are not represented.

Figure 9:
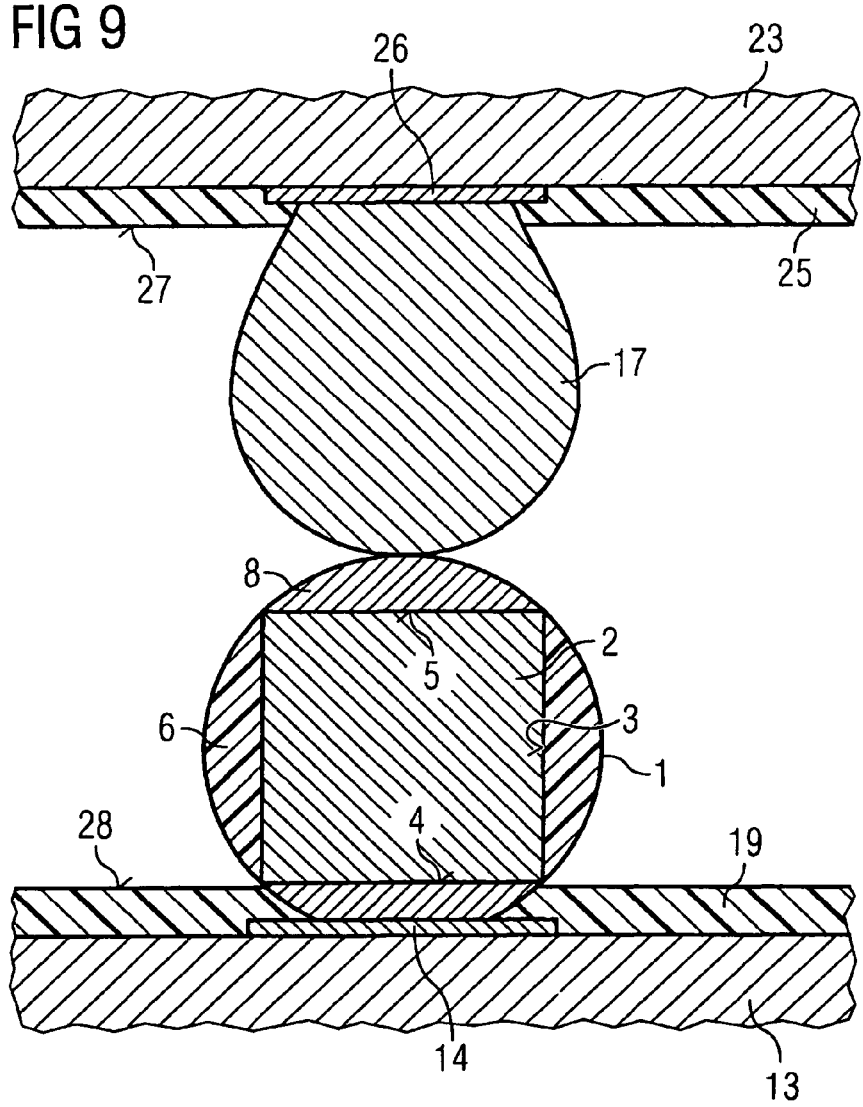
FIG. 9 illustrates a cutout from FIG. 8 in detail.

The further semiconductor device 18 likewise has on its underside 29 contact terminal areas, which in this exemplary embodiment are loaded with solder balls 17. A solder ball 17 in each case forms a solderable connecting element with a socket element 1. Such a connecting element is identified by the cutout 22 and is represented in detail in FIG. 9.

The wiring structure 23 of the second semiconductor device 18, like that of the first semiconductor device 16, is covered with a solder resist layer 25, contact terminal areas 26 being left free. Arranged on such a contact terminal area 26 on the underside 29 of the wiring substrate is the solder ball 17, which forms with the socket element 1 a solderable connecting element for the electrical connection of the semiconductor device 16 to the further semiconductor device 18.

To produce the connection, it is necessary that the socket element 1 stands perpendicularly with the longitudinal axis of the cylindrical core 2 on the contact terminal area 14. In the case of the socket element 1 according to the invention, it adopts this alignment of its own accord as a result of the different degrees of affinity to wetting of the cladding 6 and the cap 8 during the soldering process. This effect can be further enhanced by introducing the slit-shaped clearances 9 with the covering 10.

Consequently, specific arrangement and alignment of the socket element 1 on the contact area 14 is not necessary, and the processing of the socket element 1 is therefore in fact just as uncomplicated as in the case of the conventional solder ball 17.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a semiconductor device with a wiring substrate and a number of virtually spherical, solderable connecting structures, the method comprising:

providing a wire-like body with a core of an electrically conducting first material and a cladding of an electrically insulating second material;

separating the wire-like body into cylindrical segments with the core of the electrically conducting first material being exposed at ends of the cylindrical segments, wherein the cylindrical segments have an aspect ratio of around 1, the aspect ratio defined as a ratio of a length to a diameter of the cylindrical segments;

working the cylindrical segments by rounding off the edges of the cladding at the ends of the cylindrical segments to form socket elements virtually in the form of a sphere with flattened poles having a cylindrical core comprising the core of electrically conducting first material, a lateral surface comprising the cladding of electrically insulating second material, and the flattened poles forming a bottom surface and a top surface comprising the exposed ends of the cylindrical core of electrically conducting first material;

providing a wiring substrate with a wiring structure having regions for semiconductor devices and, outside these regions, positions with contact terminal areas for attaching solderable connecting structures;

loading the contact terminal areas with the socket elements as solderable connecting structures;

soldering the socket elements onto the contact terminal areas, the socket elements aligning themselves in such a way that the longitudinal axis of their core stands perpendicularly on the contact terminal area so that one of the bottom and top surfaces aligns with the contact terminal area; and loading the semiconductor device position with a semiconductor device while connecting the semiconductor device to the wiring structure.

2. A method for producing a number of semiconductor devices with wiring substrates and a number of virtually spherical solder structures, the method comprising:

providing a wire-like body with a core of an electrically conducting first material and a cladding of an electrically insulating second material;

separating the wire-like body into cylindrical segments with the core of the electrically conducting first material being exposed at ends of the cylindrical segments, wherein the cylindrical segments have an aspect ratio of around 1, the aspect ratio defined as a ratio of a length to a diameter of the cylindrical segments;

working the cylindrical segments by rounding off the edges of the cladding at the ends of the cylindrical segments to from socket elements virtually in the form of a sphere with flattened poles having a cylindrical core comprising the core of electrically conducting first material, a lateral surface comprising the cladding of electrically insulting second material, and the flattened poles forming a bottom surface and a top surface comprising the exposed ends of the cylindrical core of electrically conducting first material;

providing a panel with semiconductor device positions arranged in rows and columns, the panel having in the semiconductor device positions a wiring structure of the wiring substrates with regions for semiconductor devices and, outside these regions, positions with contact terminal areas for attaching solderable connecting structures;

loading the contact terminal areas with the socket elements as solderable connecting structures;

soldering the socket elements onto the contact terminal areas, the socket elements aligning themselves in such a way that the longitudinal axis of their core stands perpendicularly on the contact terminal area so that one of the bottom and top surfaces is soldered onto the contact terminal area;

loading the semiconductor device positions with semiconductor devices while connecting the semiconductor devices to the wiring structure; and separating the panel into individual semiconductor devices.

3. The method as claimed in claim 2, wherein a solderable metal is used as the first material.

4. The method as claimed in claim 2, wherein a thermoplastic or thermosetting material is used as the second material.

5. The method as claimed in claim 2, wherein, before the socket elements are applied to the contact terminal areas, a cap of a third material is applied to the bottom surface and/or the top surface.

6. The method as claimed in claim 2, wherein, before the socket elements are applied to the contact terminal areas, slit-shaped clearances are introduced into the bottom surface and the top surface and filled with a third material.

7. The method as claimed in claim 6, wherein the slit-shaped clearances in the bottom surface are arranged such that they are turned by 90° about the longitudinal axis of the core in relation to the slit-shaped clearances in the top surface.

8. The method as claimed in claim 5, wherein a solderable metal is used as the third material.

9. A method for producing a module of stacked semiconductor devices, comprising:

producing two or more semiconductor devices by the method as claimed in claim 1, one semiconductor device being provided as a base element and the other or others being provided as stacking elements;

providing further contact terminal areas on the underside of the stacking elements;

loading the further contact terminal areas with solder balls; and stacking the semiconductor devices while soldering the solder balls on the underside of the stacking elements onto the socket elements of the semiconductor devices respectively arranged underneath.

* * * * *